United States Patent
Jung et al.

(10) Patent No.: US 9,104,181 B1
(45) Date of Patent: Aug. 11, 2015

(54) TIME-TO-DIGITAL CONVERTER

(71) Applicant: Industry-Academic Cooperation Foundation, Yonsei University, Seoul (KR)

(72) Inventors: Seongook Jung, Seoul (KR); Jung-Hyun Park, Seoul (KR); Kyung Ho Ryu, Seoul (KR); Dong Hun Jung, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 14/690,220

(22) Filed: Apr. 17, 2015

(30) Foreign Application Priority Data

Apr. 17, 2014 (KR) .................. 10-2014-0046184

(51) Int. Cl.
  *H03M 1/50* (2006.01)
  *G04F 10/00* (2006.01)
  *H03M 1/08* (2006.01)
  *H03M 1/12* (2006.01)
  *H03L 7/089* (2006.01)
  *H03M 1/00* (2006.01)

(52) U.S. Cl.
  CPC ........... *G04F 10/005* (2013.01); *H03M 1/0836* (2013.01); *H03M 1/1245* (2013.01); *H03L 7/0891* (2013.01); *H03L 7/0895* (2013.01); *H03M 1/00* (2013.01); *H03M 1/12* (2013.01); *H03M 1/1225* (2013.01); *H03M 2201/4233* (2013.01)

(58) Field of Classification Search
  USPC .......... 341/166, 155, 156, 118, 141; 327/156, 327/159
  See application file for complete search history.

(56) References Cited

U.S. PATENT DOCUMENTS

| | | | |
|---|---|---|---|
| 8,138,843 B2 | 3/2012 | Straayer et al. | |
| 2011/0169673 A1* | 7/2011 | Henzler | ........................ 341/141 |

FOREIGN PATENT DOCUMENTS

| KR | 10-2009-0103744 | 10/2009 |
|---|---|---|
| KR | 10-2010-0082051 | 7/2010 |

* cited by examiner

*Primary Examiner* — Joseph Lauture
(74) *Attorney, Agent, or Firm* — Procopio, Cory, Hargreaves & Savitch LLP

(57) ABSTRACT

A time-to-digital converter includes a first gated ring oscillator, a second gated ring oscillator, a phase adjusting unit, and a digital converter unit. The first gated ring oscillator includes a plurality of first delay cells connected in a cyclic structure and operating in response to an enable signal. The second gated ring oscillator includes a plurality of second delay cells connected in a cyclic structure and operating in response to the enable signal. The phase adjusting unit adjusts a phase of a second circulation signal circulating in the second gated ring oscillator so as for the second circulation signal to have a predetermined phase difference with respect to a first circulation signal circulating in the first gated ring oscillator. The digital converter unit samples output signals of the first delay cells and the second delay cells to output a digital value corresponding to duration of the enable signal.

18 Claims, 5 Drawing Sheets

TIME-TO-DIGITAL CONVERTER

CROSS-REFERENCE TO RELATED APPLICATIONS

A claim for priority under 35 U.S.C. §119 is made to Korean Patent Application No. 10-2014-0046184 filed Apr. 17, 2014, in the Korean Intellectual Property Office, the entire contents of which are hereby incorporated by reference.

BACKGROUND

Embodiments of the inventive concepts described herein relate to a time digital converter, and more particularly, relate to a gated-ring-oscillator-based time-to-digital converter.

A gated-ring-oscillator-based time-to-digital converter may sample an output signals of delay cells of a gated ring oscillator to convert an enable signal generated by a time difference between a start signal and a stop signal into a digital code. The gated-ring-oscillator-based time-to-digital converter may perform first-order shaping about quantization noise. The gated-ring-oscillator-based time-to-digital converter may have excellent low noise and linearity characteristics.

That is, since the gated-ring-oscillator-based time-to-digital converter holds a state between measurement periods to transfer an error to a next measurement periods, the gated-ring-oscillator-based time-to-digital converter may have a first noise shaping characteristic where the whole quantization error value of a measurement period appears as a difference between next quantization error and previous quantization error, thereby reducing quantization noise.

However, a conventional gated-ring-oscillator-based time-to-digital converter may have a disadvantage in that resolution is restricted to a value corresponding to a delay time of an inverter (or a delay cell) of a gated ring oscillator.

SUMMARY

Embodiments of the inventive concepts provide to provide a time-to-digital converter with high resolution.

One aspect of embodiments of the inventive concept is directed to provide a time-to-digital converter is provided which includes a first gated ring oscillator, a second gated ring oscillator, a phase adjusting unit, and a digital converter unit. The first gated ring oscillator may include a plurality of first delay cells which is connected in a cyclic structure and operates in response to an enable signal. The second gated ring oscillator may include a plurality of second delay cells which is connected in a cyclic structure and operates in response to the enable signal. The phase adjusting unit may adjust a phase of a second circulation signal circulating in the second gated ring oscillator so as for the second circulation signal to have a predetermined phase difference with respect to a first circulation signal circulating in the first gated ring oscillator. The digital converter unit may sample output signals of the first delay cells and the second delay cells to output a digital value corresponding to duration of the enable signal.

The phase adjusting unit may delay the second circulation signal by half a delay time of a second delay cell.

The phase adjusting unit may include a phase interpolator configured to interpolate phases of output signals of two second delay cells, adjacent to each other, from among the second delay cells of the second gated ring oscillator to adjust a phase of the second circulation signal.

The time-to-digital converter may further include a dummy delay unit configured to delay output signals of the first delay cells by a delay time of the phase adjusting unit.

The time-to-digital converter may further include a phase comparing unit configured to compare a phase of a phase shifted signal adjusted by the phase adjusting unit and a phase of a delay signal delayed by the dummy delay unit to output a phase comparison signal; and a delay control unit configured to control a delay time of at least one of the first gated ring oscillator and the second gated ring oscillator in response to the phase comparison signal.

The digital converter unit may add values, obtained by counting edges of output signals of the first delay cells and the second delay cells during duration of the enable signal, to output the digital value.

Each of the first and second delay cells may include an inverter.

The time-to-digital converter may further include an enable signal generator unit configured to generate the enable signal using edges of a first input signal and a second input signal.

At least one of the first and second delay cells may include a core transistor; a switch transistor connected to a gate of the core transistor and configured to switch on or off the core transistor in response to the enable signal; and a transmission gate configured to transmit an output signal of other delay cell to a gate of the core transistor in response to the enable signal.

Another aspect of embodiments of the inventive concept is directed to provide a time-to-digital converter which includes a first gated ring oscillator comprising a plurality of first delay cells connected in a cyclic structure and operating in response to an enable signal; a second gated ring oscillator comprising a plurality of second delay cells connected in a cyclic structure, operating in response to the enable signal, and circulating a second circulation signal having a predetermined phase difference with respect to a first circulation signal circulating in the first gated ring oscillator; and a digital converter unit configured to output a digital value corresponding to duration of the enable signal by sampling output signals of the first delay cells and the second delay cells.

Other aspects, advantages, and salient features of the disclosure will become apparent to those skilled in the art from the following description, which, taken in conjunction with the annexed drawings, discloses various embodiments of the present disclosure.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
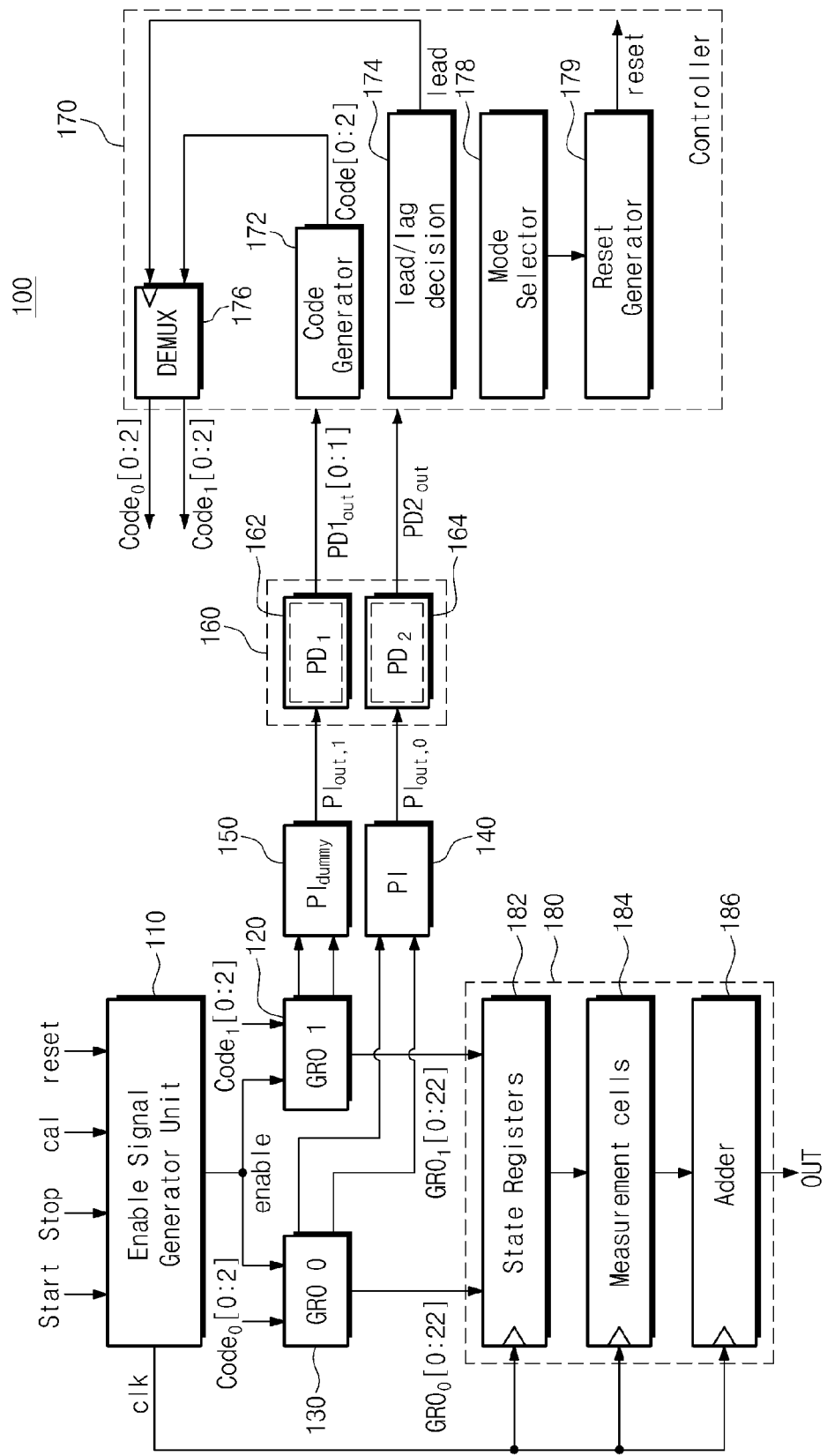
FIG. 1 is a configuration diagram of a time-to-digital converter according to an exemplary embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In the description below, it will be understood that when an element such as a layer, region, substrate, plate, or member is referred to as being "on" another element, it can be directly on the other element or intervening elements may be present. In contrast, the term "directly" means that there are no intervening elements.

A time-to-digital converter according to an exemplary embodiment of the inventive concept may include a first gated ring oscillator including a plurality of first delay cells connected in a cyclic structure and operating in response to an enable signal; a second gated ring oscillator including a plurality of second delay cells connected in a cyclic structure and operating in response to the enable signal; a phase adjusting unit configured to adjust a phase of a second circulation signal circulating in the second gated ring oscillator so as to have a predetermined phase difference with respect to a first circulation signal circulating in the first gated ring oscillator; and a digital converter unit configured to output a digital value corresponding to duration of the enable signal by sampling output signals of the first delay cells and the second delay cells. According to an exemplary embodiment of the inventive concept, it may be possible to improve the resolution of a gated-ring-oscillator-based time-to-digital converter.

FIG. 1 is a configuration diagram of a time-to-digital converter according to an exemplary embodiment of the inventive concept. Referring to FIG. 1, a time-to-digital converter 100 according to an exemplary embodiment of the inventive concept may contain an enable signal generator unit 110, a first gated ring oscillator 120, a second gated ring oscillator 130, a phase adjusting unit 140, a dummy delay unit 150, a phase comparing unit 160, a delay control unit 170, and a digital converter unit 180.

The enable signal generator unit 110 may generate an enable signal using a start signal and a stop signal. The start signal may correspond to a first input signal, and the stop signal may correspond to a second input signal. The enable signal generator unit 110 may generate the enable signal, for example, by making a rising edge from a rising edge of the start signal and a falling edge from a rising edge of the stop signal. The enable signal may be provided to the first gated ring oscillator 120 and the second gated ring oscillator 130.

The first gated ring oscillator 120 may include a plurality of first delay cells that are connected to have a cyclic structure and operate in response to the enable signal.

Figure 2:
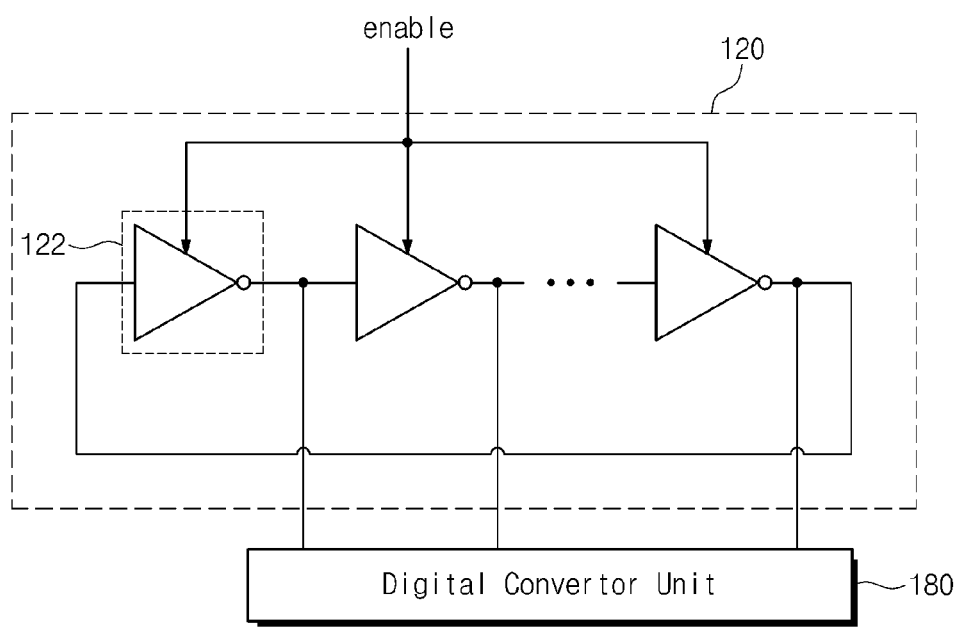
FIG. 2 is a configuration diagram illustrating a first gated ring oscillator of a time-to-digital converter according to an exemplary embodiment of the inventive concept.

FIG. 2 is a configuration diagram illustrating a first gated ring oscillator of a time-to-digital converter according to an exemplary embodiment of the inventive concept. Referring to FIG. 2, a first gated ring oscillator 120 may contain a first delay cells 122 connected to have a cyclic structure.

According to an embodiment, each of the first delay cells 122 may be formed of an inverter. The first delay cells 122 may operate in response to an enable signal generated by the enable signal generator unit 110. When the enable signal has a logically high value, a first circulation signal may be circulated through the first gated ring oscillator 120. Output signals of the first delay cells 122 may be provided to a digital converter unit 180.

Returning to FIG. 1, the second gated ring oscillator 130 may include a plurality of second delay cells connected to have a cyclic structure. The second delay cells may operate in response to the enable signal. The second gated ring oscillator 130 may be implemented to have the same structure as the first gated ring oscillator 120 illustrated in FIG. 2. When the enable signal has a logically high value, a second circulation signal may be circulated through the second gated ring oscillator 130.

The phase adjusting unit 140 may adjust a phase of the second circulation signal circulating through the second gated ring oscillator 130 such that the first circulation signal circulating through the first gated ring oscillator 120 and the second circulation signal have a predetermined phase difference. According to an embodiment, the phase adjusting unit 140 may delay the second circulation signal from the second gated ring oscillator 130 by a value corresponding to half a delay time of the second delay cell or the first delay cell.

According to an embodiment, the phase adjusting unit 140 may include a phase interpolator that interpolates phases of output signals of two different delay cells of the second delay cells in the second gated ring oscillator to adjust a phase of the second circulation signal. The dummy delay unit 150 may delay output signals of the first delay cells 122, corresponding to output signals of the second delay cells, by a delay time of the phase adjusting unit 140.

Figure 3:
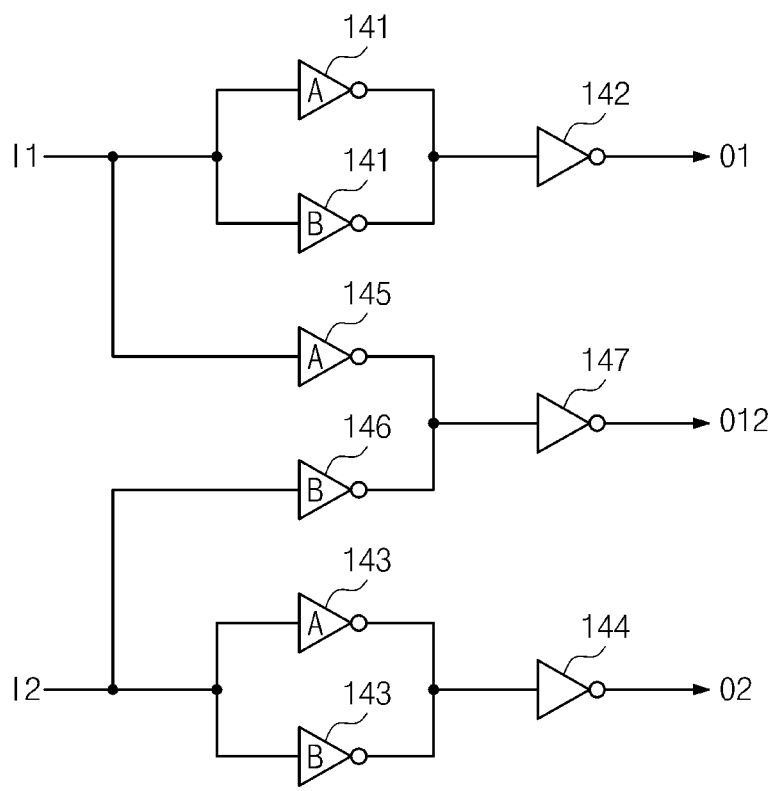
FIG. 3 is a configuration diagram schematically illustrating a phase adjusting unit of a time-to-digital converter according to an exemplary embodiment of the inventive concept.

FIG. 3 is a configuration diagram schematically illustrating a phase adjusting unit of a time-to-digital converter according to an exemplary embodiment of the inventive concept. Referring to FIG. 3, a phase adjusting unit 140 may contain the following components: two first inverters 141 connected in parallel, inverting a first input signal I1, and outputting the inverted signal from the first input signal I1, a second inverter 142 inverting outputs of the first inverters, and outputting the inverted outputs, two third inverters 143 connected in parallel and inverting a second input signal I2, and outputting the inverted signal from the second input signal I2, a fourth inverter 144 inverting outputs of the second inverters 143, and outputting the inverted signal, a fifth inverter 145 inverting the first input signal I1, and outputting the inverted signal, a sixth inverter 146 inverting the second input signal I2, and outputting the inverted signal, and a seventh inverter 147 inverting outputs of the fifth and sixth inverters 145 and 146, and outputting the inverted signal.

In FIG. 3, the first input signal I1 and the second input signal I2 may be two output signals of second odd-numbered delay cells or second even-numbered delay cells, adjacent to each other, from among second delay cells of a second gated ring oscillator 130. In this case, a phase difference corresponding to a delay time of second two delay cells in the second gated ring oscillator 130 may be generated between the first input signal I1 and the second input signal I2, and a phase difference corresponding to a delay time of second two delay cells in the second gated ring oscillator 130 may be also generated between an output signal O1 of the second inverter 142 and an output signal O2 of the fourth inverter 144.

Since a third output signal O12 from the seventh inverter 147 has a phase corresponding to the middle between a phase of the first output signal O1 and a phase of the second output signal O2, a phase difference corresponding to a delay time of a second delay cell of the second gated ring oscillator 130 may be generated between the first output signal O1 and the third output signal O12. An output signal having an intermediate phase between the first output signal O1 and the third output signal O12 may be obtained by interpolating a phase one more through the phase adjusting unit 140 using the first output signal O1 and the third output signal O12 as an input. Accordingly, it may be possible to generate a phase shifted signal that is delayed by half a delay time of a second delay cell in the second gated ring oscillator 130.

A phase shifted signal $PI_{out,0}$ phase-adjusted by the phase adjusting unit 140 and a delay signal $PI_{out,1}$ delayed by a dummy delay unit 150 may be provided to a phase comparing unit 160. The phase comparing unit 160 may compare a phase of the phase shifted signal $PI_{out,0}$ adjusted by the phase adjusting unit 140 and a phase of the delay signal $PI_{out,1}$ delayed by the dummy delay unit 150 and may output phase comparison signals $PD_{1OUT}$ and $PD_{2OUT}$ as a comparison result. The phase comparing unit 160 may contain a first phase comparator 162 and a second phase comparator 164 having different phase detection ranges.

The phase comparison signals $PD_{1OUT}$ and $PD_{2OUT}$ may be provided to a delay control unit 170. The delay control unit 170 may control a delay time of a first gated ring oscillator 120 or a second gated ring oscillator 130 according to the phase comparison signals $PD_{1OUT}$ and $PD_{2OUT}$.

That is, when a phase of the phase shifted signal $PI_{out,0}$ leads a phase of the delay signal $PI_{out,1}$, the delay control unit 170 may output a first control code $Code_1[0:2]$ to increase a delay time of a first gated ring oscillator 120; when a phase of the phase shifted signal $PI_{out,0}$ lags a phase of the delay signal $PI_{out,1}$, the delay control unit 170 may output a second control code $Code_0[0:2]$ to increase a delay time of a second gated ring oscillator 130.

According to an embodiment, the delay control unit 170 may contain a code generator 172, a lead/lag decision unit 174, a de-multiplexer 176, a mode selector 178, and a reset generator 179. The code generator 172 may generate a selection code Code[0:2] according to the phase comparison signals $PD_{1OUT}$ and $PD_{2OUT}$ from the phase comparing unit 160 and may provide the selection code Code[0:2] to the de-multiplexer 176.

When a phase difference between a phase shifted signal $PI_{out,0}$ and a delay signal $PI_{out,1}$ has a predetermined value according to the phase comparison signals $PD_{1OUT}$ and $PD_{2OUT}$, the lead/lag decision unit 174 may output a lead signal or a lag signal as a sampling signal of the de-multiplexer 176.

When receiving the sampling signal, the de-multiplexer 176 may output a first control code $Code_0[0:2]$ or a second control signal $Code_1[0:2]$ to a first gated ring oscillator 120 or a second gated ring oscillator 130 according to the selection code Code[0:2]. Accordingly, a delay time of the first gated ring oscillator 120 or the second gated ring oscillator 130 may be adjusted.

The mode selector 178 may select a calibration mode and an operation mode. That is, at the beginning, that is, before an operation mode, the mode selector 178 may select the calibration mode to synchronize frequencies and phases of the first and second gated ring oscillators 120 and 130. When the calibration mode ends, the mode selector 178 may select the operation mode to convert an enable signal into a digital value.

The reset generator 179 may generate a reset signal in response to a mode decision signal of the mode selector 178. That is, the reset generator 179 may generate the reset signal in response to the mode decision signal that is output from the mode selector 178 when the calibration mode is completed and when measurement is completed every period of the enable signal in the operation mode.

An enable signal generator 110 may generate an enable signal in response to the reset signal from the reset generator 179 and may provide the enable signal to the first gated ring oscillator 120 and the second gated ring oscillator 130. In the calibration mode, the enable signal generator 110 may provide the first gated ring oscillator 120 and the second gated ring oscillator 130 with a calibration signal cal, not the enable signal. The calibration mode may be performed while the calibration signal cal has a logically high level.

A digital converter unit 180 may sample output signals of first delay cells of the first gated ring oscillator 120 and second delay cells of the second gated ring oscillator 130 to output a digital value corresponding to duration of the enable signal. According to an embodiment, the digital converter unit 180 may count and add edges of output signals of the first delay cells and the second delay cells during the duration of the enable signal and may output a digital value as a result.

According to an embodiment, the digital converter unit 180 may contain a state register 182, a measurement cell 184, and an adder 186. The state register 182 may receive an output signal $GRO_1[0:22]$ of the first gated ring oscillator 120 and an output signal $GRO_0[0:22]$ of the second gated ring oscillator 130 and may store a state whenever receiving a sampling clock clk.

The measurement cell 184 may count output signal values of the first gated ring oscillator 120 and the second gated ring oscillator 130. The adder 186 may add and output count results about the output signal values of the first gated ring oscillator 120 and the second gated ring oscillator 130 received from the measurement cell 184. An output value of the adder 186 may indicate a time corresponding to a pulse width of the enable signal.

Figure 4:
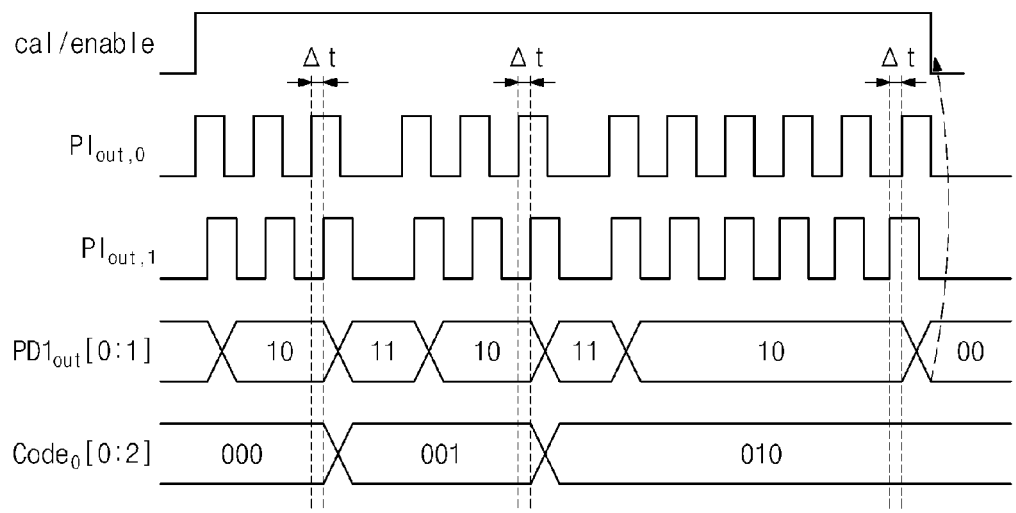
FIG. 4 is a signal timing diagram for describing an operation of a time-to-digital converter according to an exemplary embodiment of the inventive concept.
Figure 4:
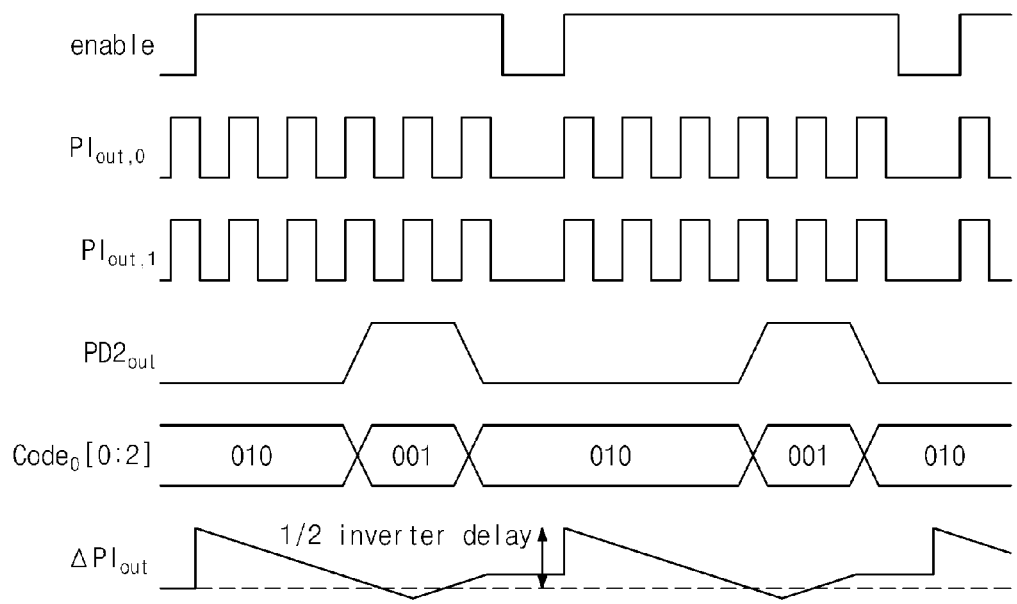

FIG. 4 is a signal timing diagram for describing an operation of a time-to-digital converter according to an exemplary embodiment of the inventive concept. An operation of a time-to-digital converter 100 according to an exemplary embodiment of the inventive concept will be more fully described with reference to FIGS. 1 and 4. First, if a calibration signal cal is applied, gated ring oscillators 120 and 130 may start to oscillate, and a calibration mode of operation may be performed. For example, two adjacent rising edges (e.g., $GRO_0[20]$ and $GRO_0[22]$) of a second circulation signal circulating in a second gated ring oscillator 130 may be provided to a phase adjusting unit 140. At this time, the two adjacent rising edges may be output signals of adjacent odd-numbered or even-numbered delay cells of delay cells.

The phase adjusting unit 140 may generate a phase shifted signal $PI_{out,0}$ having a rising edge at a first quarter point between the two adjacent rising edges. Output signals (a first circulation signal) from the first gated ring oscillator 120 may pass through a dummy delay unit 150 without phase interpolation. Two rising edges (e.g., $GRO_1[20]$ and $GRO_1[22]$) of the output signals from the first gated ring oscillator 120 may be delayed as much as a delay time of the phase adjusting unit 140 by the dummy delay unit 150.

A phase shifted signal $PI_{out,0}$ and a delay signal $PI_{out,1}$ may ideally have a phase difference corresponding to half a delay time of a delay cell, that is, an inverter. The phase shifted signal $PI_{out,0}$ and the delay signal $PI_{out,1}$ may be provided to the phase comparing unit 160. In a calibration mode, a first phase comparator 162 may output a bit value of "10" when a phase difference between the phase shifted signal $PI_{out,0}$ and the delay signal $PI_{out,1}$ is below a first phase difference value $\Delta t$ (e.g., 50 ps); it may output a bit value of "11" when a phase difference between the phase shifted signal $PI_{out,0}$ and the delay signal $PI_{out,1}$ becomes greater than the first phase difference value $\Delta t$. Note that the first phase difference value $\Delta t$ is illustrated exaggeratedly in FIG. 4.

At the beginning of calibration, the gated ring oscillators 120 and 130 may have some different periods due to mismatch, but a phase difference may gradually increase as continuing to oscillate. When a "11" value is output as a consequence of determining that a phase difference between the gated ring oscillators 120 and 130 is greater than the first phase difference value $\Delta t$, a lead/lag decision unit 174 may determine which one of the gated ring oscillators is leading a phase of the other.

Accordingly, a control code may be output to a gated ring oscillator by a selection code output from a code generator 172, and a delay time of a gated ring oscillator having a relatively leading phase may increase. Next, the gated ring oscillators 120 and 130 all may be reset. Just as a bit value of "00" is output while iterating the above-described operation, that is, just as a phase of a gated ring oscillator that has been leading a phase of other gated ring oscillator begins lagging a phase of the other gated ring oscillator, a relevant gated ring oscillator may be reset, and the calibration mode may be terminated.

In an operation mode, if a start signal and a stop signal are applied to an enable signal generator unit 110, an enable signal may be generated using two rising edges of the start signal and the stop signal. In the operation mode, a second phase comparator 164 may detect a phase difference between a phase shifted signal $PI_{out,0}$ and a delay signal $PI_{out,1}$ more accurately in comparison with the first phase detector 162 and may output a phase comparison signal $PD_{2OUT}$ as a detection result.

That is, the two gated ring oscillators 120 and 130 calibrated may oscillate while the enable signal is applied thereto, and at this time the second phase comparator 164 locks the phase shifted signal $PI_{out,0}$ and the delay signal $PI_{out,1}$. Accordingly, the second phase comparator 164 may continue to tune a delay code such that the two gated ring oscillators 120 and 130 have a phase difference corresponding to half a delay time of a delay cell. A phase difference between the phase shifted signal $PI_{out,0}$ and the delay signal $PI_{out,1}$ may have a value less than half a delay time of one delay cell. Accordingly, the resolution of the time-to-digital converter may double that of a time-to-digital converter using one gated ring oscillator.

Figure 5:
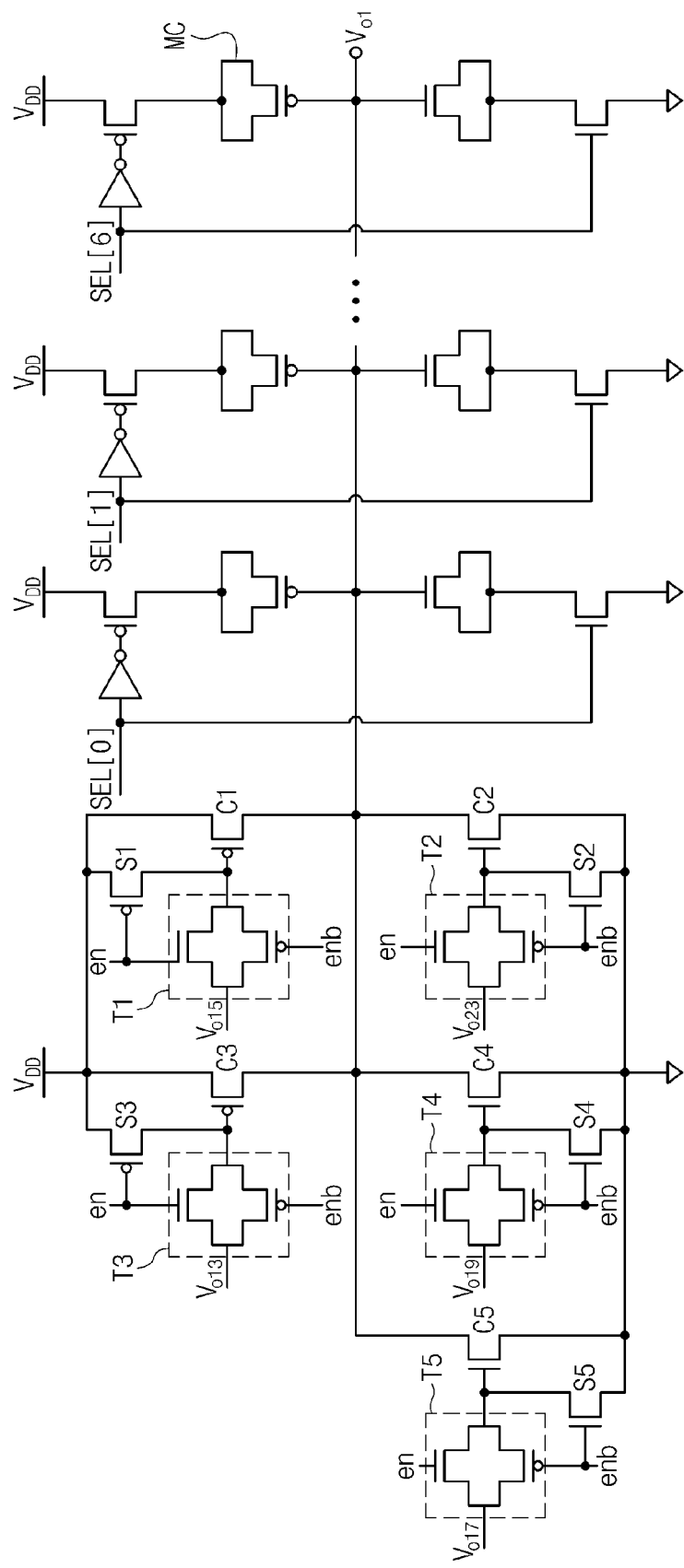
FIG. 5 is a configuration diagram illustrating one of a plurality of delay cells of a gated ring oscillator in a time-to-digital converter according to an exemplary embodiment of the inventive concept.

FIG. 5 is a configuration diagram illustrating one of a plurality of delay cells of a gated ring oscillator in a time-to-digital converter according to an exemplary embodiment of the inventive concept. One of 23 delay cells may be illustrated in FIG. 5. Referring to FIG. 5, a delay cell may contain core transistors C1 to C5, switch transistors S1 to S5, and transmission gates T1 to T5. The switch transistors S1 to S5 may be connected to gates of the core transistors C1 to C5 and may switch on or off the core transistors C1 to C5 in response to an enable signal. The transmission gates T1 to T5 may transfer output signals of other delay cells in response to the enable signal.

In FIG. 5, the first core transistor C1 and the third core transistor C3 may be formed of PMOS transistors, and the second core transistor C2, the fourth core transistor C4, and the fifth core transistor C5 may be formed of NMOS transistors. Drains of the first and second core transistors C1 and C2 may be interconnected, and a supply voltage and a ground voltage may be applied to sources of the first and second core transistors C1 and C2, respectively. Drains of the third and fourth core transistors C3 and C4 may be interconnected, and the supply voltage and the ground voltage may be applied to sources of the third and fourth core transistors C3 and C4, respectively. A drain of the fifth core transistor C5 may be connected to drains of the first to fourth core transistors C1 to C4, and a ground voltage may be applied to a source of the fifth core transistor C5.

The first to fifth transmission gates T1 to T5 may be implemented in the form of parallel connection structure of a PMOS transistor and an NMOS transistor, an enable signal may be applied to gates of the NMOS transistors of the first to fifth transmission gates T1 to T5, and an inverted version of enable signal enb may be applied to gates of the PMOS transistors of the first to fifth transmission gates T1 to T5. According to an embodiment, the first to fifth transmission gates T1 to T5 may transmit output signals Vo15, Vo23, Vo13, Vo19, and Vo17 of $15^{th}$, $23^{rd}$, $13^{th}$, $19^{th}$, and $17^{th}$ delay cells to gates of the first to fifth core transistors C1 to C5 in response to the enable signal and inverted enable signal en and enb.

The first switch transistor S1 and the third switch transistor S3 may be formed of PMOS transistors, and the second switch transistor S2, the fourth switch transistor S4, and the fifth switch transistor S5 may be formed of NMOS transistors. Drains of the first to fifth switch transistors S1 to S5 may be connected to the gates of the first to fifth core transistors C1 to C5, respectively. The enable signal en may be applied to gates of the first and third switch transistors S1 and S3, and the supply voltage may be applied to sources thereof. The inverted version of enable signal enb may be applied to gates of the second, fourth, and fifth switch transistors S2, S4, and S5, respectively. Though not described, "MC" in FIG. 5 may indicate a MOS capacitor of which the delay time varies according to a control code SEL[0:6] applied to a delay cell.

According to a delay cell of FIG. 5 used to constitute a gated ring oscillator, drains of the switch transistors S1 to S5 may not be connected to sources of the core tarns C1 to C5 to constitute a head/foot switch, but they may be connected to gates of the core transistors C1 to C5. Accordingly, it may be possible to prevent charge sharing between a source of a PMOS core transistor, a source of an NMOS core transistor, and drains of a PMOS and NMOS core transistors, and simultaneously an enable buffer having a large area may be unnecessary.

According to an exemplary embodiment of the inventive concept, it is possible to improve the resolution of a time-to-digital converter.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A time-to-digital converter comprising:
   a first gated ring oscillator comprising a plurality of first delay cells connected in a cyclic structure, the first delay cells operating in response to an enable signal;
   a second gated ring oscillator comprising a plurality of second delay cells connected in a cyclic structure, the second delay cells operating in response to the enable signal;
   a phase adjusting unit configured to adjust a phase of a second circulation signal circulating in the second gated ring oscillator so as for the second circulation signal to have a predetermined phase difference with respect to a first circulation signal circulating in the first gated ring oscillator; and
   a digital converter unit configured to sample output signals of the first delay cells and the second delay cells to output a digital value corresponding to duration of the enable signal.

2. The time-to-digital converter of claim 1, wherein the phase adjusting unit delays the second circulation signal by half a delay time of a second delay cell.

3. The time-to-digital converter of claim 1, wherein the phase adjusting unit comprises:
   a phase interpolator configured to interpolate phases of output signals of two second delay cells, adjacent to each other, from among the second delay cells of the second gated ring oscillator to adjust a phase of the second circulation signal.

4. The time-to-digital converter of claim 3, further comprising:
   a dummy delay unit configured to delay output signals of the first delay cells, by a delay time of the phase adjusting unit.

5. The time-to-digital converter of claim 4, further comprising:
   a phase comparing unit configured to compare a phase of a phase shifted signal adjusted by the phase adjusting unit and a phase of a delay signal delayed by the dummy delay unit to output a phase comparison signal; and
   a delay control unit configured to control a delay time of at least one of the first gated ring oscillator and the second gated ring oscillator in response to the phase comparison signal.

6. The time-to-digital converter of claim 1, wherein the digital converter unit adds values, obtained by counting edges of output signals of the first delay cells and the second delay cells during duration of the enable signal, to output the digital value.

7. The time-to-digital converter of claim 1, wherein each of the first and the second delay cells comprises an inverter.

8. The time-to-digital converter of claim 1, further comprising:
   an enable signal generator unit configured to generate the enable signal using edges of a first input signal and a second input signal.

9. The time-to-digital converter of claim 1, wherein at least one of the first and the second delay cells comprises:
   a core transistor;
   a switch transistor connected to a gate of the core transistor, the switch transistor being configured to switch on or off the core transistor in response to the enable signal; and
   a transmission gate configured to transmit an output signal of other delay cell to a gate of the core transistor in response to the enable signal.

10. A time-to-digital converter comprising:
    a first gated ring oscillator comprising a plurality of first delay cells connected in a cyclic structure, the first delay cells operating in response to an enable signal, the first gated ring oscillator circulating a first circulation signal;
    a second gated ring oscillator comprising a plurality of second delay cells connected in a cyclic structure, the second delay cells operating in response to the enable signal, the second gated ring oscillator circulating a second circulation signal having a predetermined phase difference with respect to the first circulation signal circulating in the first gated ring oscillator; and a digital converter unit configured to sample output signals of the first delay cells and the second delay cells to output a digital value corresponding to duration of the enable signal.

11. The time-to-digital converter of claim 10, further comprising:
a phase adjusting unit configured to delay the second circulation signal by half a delay time of a second delay cell.

12. The time-to-digital converter of claim 11, wherein the phase adjusting unit comprises:
a phase interpolator configured to interpolate phases of output signals of two second delay cells, adjacent to each other, from among the second delay cells of the second gated ring oscillator to adjust a phase of the second circulation signal.

13. The time-to-digital converter of claim 12, further comprising:
a dummy delay unit configured to delay output signals of the first delay cells by a delay time of the phase adjusting unit.

14. The time-to-digital converter of claim 13, further comprising:
a phase comparing unit configured to compare a phase of a phase shifted signal adjusted by the phase adjusting unit and a phase of a delay signal delayed by the dummy delay unit to output a phase comparison signal; and a delay control unit configured to control a delay time of at least one of the first gated ring oscillator and the second gated ring oscillator in response to the phase comparison signal.

15. The time-to-digital converter of claim 10, wherein the digital converter unit adds values, obtained by counting edges of output signals of the first delay cells and the second delay cells during duration of the enable signal, to output the digital value.

16. The time-to-digital converter of claim 10, wherein each of the first and the second delay cells comprises an inverter.

17. The time-to-digital converter of claim 10, further comprising:
an enable signal generator unit configured to generate the enable signal using edges of a first input signal and a second input signal.

18. The time-to-digital converter of claim 10, wherein at least one of the first and the second delay cells comprises:
a core transistor;
a switch transistor connected to a gate of the core transistor, the switch transistor being configured to switch on or off the core transistor in response to the enable signal; and
a transmission gate configured to transmit an output signal of other delay cell to a gate of the core transistor in response to the enable signal.

* * * * *